United States Patent
Yoo

(10) Patent No.: US 7,389,741 B2
(45) Date of Patent: Jun. 24, 2008

(54) APPARATUS OF FABRICATING A DISPLAY DEVICE

(75) Inventor: Kwang Jong Yoo, Kyoungsangbuk-do (KR)

(73) Assignee: LG. Philips LCD. Co., Ltd, Seoul (KR)

( * ) Notice: Subject to any disclaimer, the term of this patent is extended or adjusted under 35 U.S.C. 154(b) by 272 days.

(21) Appl. No.: 10/872,306

(22) Filed: Jun. 18, 2004

(65) Prior Publication Data

US 2004/0261715 A1 Dec. 30, 2004

(30) Foreign Application Priority Data

Jun. 27, 2003 (KR) .................. 10-2003-0042573

(51) Int. Cl.
*H01L 21/3065* (2006.01)
(52) U.S. Cl. .................. 118/723 E; 156/345.47
(58) Field of Classification Search ............ 118/723 E; 156/345.43, 345.44, 345.45, 345.46, 345.47; 315/111.21
See application file for complete search history.

(56) References Cited

U.S. PATENT DOCUMENTS 5,478,429 A * 12/1995 Komino et al. ........ 156/345.44

2003/0085661 A1* 5/2003 Kwon .................. 315/111.21

FOREIGN PATENT DOCUMENTS

| JP | 61-174721 | | 8/1986 |
| JP | 2001015298 A | * | 1/2001 |
| KR | 2003-0008228 | | 1/2003 |
| WO | WO 9533868 A1 | * | 12/1995 |
| WO | WO 0161727 A1 | * | 8/2001 |

* cited by examiner

*Primary Examiner*—Parviz Hassanzadeh
*Assistant Examiner*—Anna Crowell
(74) *Attorney, Agent, or Firm*—Brinks Hofer Gilson & Lione

(57) ABSTRACT

A display device fabricating apparatus includes a radio frequency generator and a vacuum chamber. A first electrode and a second electrode that receive power from the radio frequency generator form a plasma using a gas inside the vacuum chamber. A power supply line supplies power to the first electrode from the radio frequency generator. A refrigerating part uses a refrigerant other than air in order to remove the heat generated from the power supply line. The refrigerant is circulated through a system that cools the refrigerant below the ambient external temperature before the refrigerant is used to cool the power supply line and re-cool or re-liquefy the refrigerant that has been heated by the power supply line.

12 Claims, 10 Drawing Sheets

APPARATUS OF FABRICATING A DISPLAY DEVICE

This application claims the benefit of the Korean Patent Application No. P2003-42573 filed on Jun. 27, 2003, which is hereby incorporated by reference.

BACKGROUND OF THE INVENTION

1. Field of the Invention

The present invention relates to a method and apparatus of fabricating a display device, and more particularly to a method and apparatus of fabricating a display device that is adaptive for minimizing power loss.

2. Description of the Related Art

Generally, a liquid crystal display device controls the light transmissivity of liquid crystal by using an electric field, thereby displaying a picture. For this, the liquid crystal display device includes a liquid crystal display panel where liquid crystal cells are arranged in a matrix, and a driving circuit to drive the liquid crystal display panel. The liquid crystal display panel includes pixel electrodes and a common electrode to apply the electric field to each of the liquid crystal cells. Generally, the pixel electrode is formed on a lower substrate by liquid crystal cells, but the common electrode is formed to be integrated with the entire surface of an upper substrate. Each of the pixel electrodes is connected to a thin film transistor TFT which is used as a switching device. The pixel electrode along with the common electrode drives the liquid crystal cell in accordance with data signals supplied through the thin film transistor.

The lower substrate of the liquid crystal display requires a plurality of mask processes as well as a semiconductor process, thus its fabrication process is complicated and becomes one of the major causes of increase in the manufacturing cost of the liquid crystal display panel. Thus, reducing the number of mask processes in fabricating the lower substrate has become the subject of recent interest. Specifically, as one of the mask processes includes several (in fact, 5) processes such as a deposition process, a cleaning process, photolithography, an etching process, an exfoliation process and an inspection process, reducing the 5-mask process to a 4-mask process has become of interest.

FIGS. 1 and 2 are a plan view and a sectional diagram representing a lower substrate formed in a 4-mask process.

Referring to FIGS. 1 and 2, a lower substrate 1 of a liquid crystal display device includes a thin film transistor TFT (TP) located at an intersection of a data line 4 and a gate line 2, and a pixel electrode 22 connected to a drain electrode 10 of the TFT (TP)

The TFT (TP) includes a gate electrode connected to the gate line 2, a source electrode 8 connected to the data line 4, and a drain electrode 10 connected to the pixel electrode 22 through a drain contact hole 20. Also, the TFT (TP) further includes semiconductor layers 14, 16 to form a conductive channel between the source electrode 8 and the drain electrode 10 by a gate signal supplied to the gate electrode 6. The TFT (TP) selectively supplies a data signal from the data line 4 to the pixel electrode 22 in response to the gate signal from the gate line 2.

The pixel electrode 22 is formed of a transparent conductive material of which light transmissivity is high, and is located at a cell area which is divided by the data line 4 and the gate line 2. The pixel electrode 22 is formed on a protective layer 18 that is spread on the entire surface of the substrate 1, and is electrically connected to the drain electrode 10 through the drain contact hole 20 that runs through the protective layer 18. The pixel electrode 22 generates a potential difference with a common transparent electrode (not shown) formed on an upper substrate (not shown) by the data signal supplied via the TFT (TP). The potential difference causes liquid crystal to be rotated due to dielectric constant anisotropy. The liquid crystal is located between the lower substrate 1 and the upper substrate (not shown). The rotating liquid crystal in this way transmits the light incident from a light source (not shown) via the pixel electrode 22 to the upper substrate.

The fabricating method of the lower substrate of the liquid crystal display device is described as follows in conjunction with FIG. 3A to 3D.

Referring to FIG. 3A, a gate pattern including the gate electrode (6) and a gate line (2) is formed on the lower substrate 1.

For this, a gate metal layer is deposited by a deposition method such as sputtering. The gate metal layer is formed of aluminum Al or aluminum alloy. The gate metal layer is patterned by photolithography using a first mask and an etching process to form the gate electrode 6 and the gate line 2 on the lower substrate 1.

Referring to FIG. 3B, a data pattern is formed on the lower substrate 1 where a gate pattern has been formed. The data pattern includes a gate insulating film 12, an active layer 14, an ohmic contact layer 16, a source electrode 8, a drain electrode 10 and a data line 4.

For this, the gate insulating film 12, first and second semiconductor layers and a data metal layer are sequentially deposited on the lower substrate 1 by a deposition method such as chemical vapor deposition and sputtering. The gate insulating film 12 is formed of inorganic material such as silicon oxide $SiO_x$ or silicon nitride $SiN_x$, the first semiconductor layer is formed of amorphous silicon that is not intentionally doped with impurities, the second semiconductor layer is formed of amorphous silicon that is doped with n-type or p-type impurities, and the data metal layer is formed of molybdenum Mo or molybdenum alloy.

A photo resist pattern is formed on the data metal layer by photolithography using a second mask. In this case, the second mask is a diffractive mask having a diffraction part, and the diffractive mask is used at a channel part of the TFT (TP), thus the photo resist pattern of the channel part is relatively lower in height than a source/drain part.

The data metal layer is patterned by a wet etching process using the photo resist pattern, thereby forming the data pattern including the data line 4, a storage electrode (not shown), the source electrode 8 and the drain electrode 10.

Then, the first and second semiconductor layers are simultaneously patterned by a dry etching process using the same photo resist pattern to form an active layer 14 and an ohmic contact layer 16.

And, after removing the photo resist pattern that is relatively lower in height at the channel part by an ashing process, the data metal layer and ohmic contact layer of the channel part are etched by the dry etching process. Accordingly, the active layer of the channel part is exposed to separate the source electrode from the drain electrode.

Then, the photo resist left on the data metal layer is removed by a stripping process.

Referring to FIG. 3C, a protective film 18 is formed on the gate insulating film 12 where the data pattern has been formed.

For this, an insulating material is deposited on the gate insulating film 12 to form the protective film 18. The protective film 18 is formed of inorganic insulating material such as silicon nitride $SiN_x$ and silicon oxide $SiO_x$, or organic insulating material such as acrylic organic compound, benzocyclobutene BCB and perflurocyclobutane PFCB. Subsequently, the protective film 18 is patterned by a photolithography using a third mask and the etching process to form a drain contact hole 20. The drain contact hole 20 runs through the protective film 18 to form the drain electrode 10 exposed.

Referring to FIG. 3D, the pixel electrode 22 is formed on the protective film 18.

For this, a transparent metal layer is formed on the protective film 18 by a deposition method such as sputtering. The transparent metal layer is formed of indium tin oxide ITO, indium zinc oxide IZO and indium tin zinc oxide ITZO. Subsequently, the transparent metal layer is patterned by a photolithography using a fourth mask and the etching process to form the pixel electrode 22. The pixel electrode 22 is connected to the drain electrode 10 through the drain contact hole 20 that runs through the protective film 18.

In the known liquid crystal display pattern, the gate pattern and the contact hole formed on the protective film and the channel layer formed between the source and drain electrodes are patterned by the dry etching process. Such a dry etching process is performed by a dry etching apparatus, as shown in FIG. 4.

FIG. 4 is a diagram representing a known dry etching apparatus.

Referring to FIG. 4, the known dry etching apparatus includes a vacuum chamber 30 forming a closed space 90 therewithin to accommodate and etch an object, a plasma generator to receive voltage and generate a discharge voltage for making plasma in the closed space 90, a gas supplier 50 to provide etching gas into the vacuum chamber 30, and a cooling chamber to cool a conductor.

The vacuum chamber 30 includes a body part 40, and a cover part 32 combined with the body part 40 to form the closed space 90 where etching process is performed.

The body part 40 includes a side wall part 40a forming an outer wall of the vacuum chamber 30, and a bottom part 40b formed to be integrated with the side wall part 40a. A pumping line 44 is installed at part of the bottom part 40b. The pumping line 44 is connected to a pump (not shown) that controls the pressure of the closed space 90. Also, part of an electrode forming the plasma generator is located at the central area of the bottom part 40b.

The cover part 32 is formed to correspond to the upper end part of the body part 40 and is stuck to the body part 40 to be able to open and shut. It is desirable to have a sealing device so that the cover part 32 can prevent gas leakage from the closed space 90 after being assembled with the body part 40. Also, a chamber hole 56 is formed at the cover part 32 to supply plasma etching gas to the closed space 90.

The plasma generator includes a radio frequency generator 70 to generate AC power of high frequency, an RF match box 80 to supply to the vacuum chamber 30 the power generated from the radio frequency generator 70, a first electrode 34 and a second electrode 42 of plate shape to receive the generated power from the radio frequency generator 70 and generate an electric field for forming the plasma. The power generated from the radio frequency generator 70 is transmitted to the RF match box 80 through a first conductor 70a, and the power transmitted to the RF match box 80 is transmitted to a first electrode 34 through a second conductor 70b.

The radio frequency generator 70 generates a power with frequency of 13.56 MHz and capacity of 10 KW, so that reactive particles forming the plasma can oscillate in both directions, i.e. towards an anode electrode and a cathode electrode. The power is determined by a HF AC voltage and a HF AC current generated from the radio frequency generator 70.

The RF match box 80 squares the impedance of the inside of the vacuum chamber 30 with the impedance of the radio frequency generator 70, and equally sustains the phase of the HF AC voltage supplied from the radio frequency generator 70 and the phase of the AC voltage supplied to the vacuum chamber 30. That is, if the phase of the AC voltage generated from the radio frequency generator 70 does not match the phase of the AC voltage supplied to the vacuum chamber 30, dry etching does not occur, and the dry etching apparatus and the vacuum chamber 30 may be damaged by a sudden energy burst. In order to reduce these risks, the RF match box 80 is installed between the radio frequency generator 70 and the vacuum chamber 30.

The first electrode 34 has a plate shape and is installed at the cover part 32 and connected to the radio frequency generator 70.

The second electrode 42 has a plate shape and is located at the bottom part 40b to form a space for a glow discharge by keeping a designated gap with the first electrode 34. A supporting stand 46 is installed on the upper surface to hold a TFT lower substrate 48 which is to be etched.

The gas supplier 50 includes a gas supplying tube 52 that leads plasma etching gas to the vacuum chamber 30. The plasma etching gas is generated from a gas generator (not shown) that is installed at the outside of the vacuum chamber 30. A gas guide 54 combined with the gas supplying tube 52 and a chamber hole 56 are used to inject the etching gas supplied through the gas supplying tube 52 into the inside of the vacuum chamber 30.

The gas generator (not shown) has a closed space and generates the etching gas, by chemical reaction in the inside of the gas generator. The gas generator generates chlorine gas $Cl_2$, hydrogen chloride HCl, Sulfur Hexafluoride $SF_6$, Oxygen gas $O_2$ and carbon tetrafluoride $CF_4$ in accordance with the object being etching.

The gas supplying tube 52 is a pipe that leads the etching gas generated in the gas generator to the vacuum chamber 30, and should be strongly corrosion resistant as the etching gas is poisonous. Also, the gas supplying tube 52 includes a member that prevents impurities from being added to the etching gas flowing into the inside of the dry etching apparatus.

The gas guide 54 transports the etching gas that flows through the gas supplying tube 52 into the vacuum chamber 30. The gas guide 54 should be resistant to corrosion because it too transmits the poisonous gas. The gas guide 54 additionally should have enough durability so that it can bear the pressure of the vacuum formed in the closed space 90. Also, as the gas guide 54 is combined with the chamber hole 56 for the etching gas to be injected into the chamber, it should have a good resistance to corrosion with regard to the plasma.

The cooling chamber 60 cools a second conductor 70b when supplying power to a first electrode 34 through the second conductor 70b after the power generated from the radio frequency generator 70 is transmitted to the RF match box 80 through a first conductor 70a. In other words, because the resistance of the second conductor 70b increases if a large amount of heat is generated in the second conductor 70b, the cooling chamber 60 cools the second conductor 70b and thereby permits the power to be transmitted with a decreased amount of loss. The cooling chamber 60 has a fan that provides air flow into the cooling chamber 60. The second conductor 70b is cooled by an air-cooling system using the fan.

In order to etch the TFT lower substrate 48 with an etching apparatus having such a configuration, firstly, the TFT lower substrate 48 in which the protective film has been deposited is located at the upper surface of the supporting stand 46, and then the pressure of the inside of the closed space 90 is decreased to 7.7 mtorr to 5.6 mtorr, a suitable pressure for forming plasma in when using the pump. A gas that can etch the TFT lower substrate 48 is then supplied through the gas guide 54.

Subsequently, when applying the AC voltage of 13.56 MHz through the radio frequency generator 70 between the first electrode 34 and the second electrode 42, free electrons inside the closed space 90 are accelerated by the electric field and collide with the etching gas molecules. Accordingly, the etching gas molecules gain energy, and then are divided into ions, electrons, radicals by going through an ionization decomposition process to form a plasma. The radicals diffuse and the ions or the electrons move along the direction of the applied electric field and physically or chemically react with the protective film of the TFT lower substrate 48 corresponding to an area in which a contact hole is to be formed, thereby etching the surface. The chemical reactant generated as an etching result is discharged to the outside along the pumping line 44 by the pump to maintain the pressure of the closed space 90.

After the power generated from the radio frequency generator 70 is transmitted to the RF match box 80 through the first conductor 70a, the cooling chamber 60 is used for removing the heat generated in the second conductor 70b to increase the power transmission when supplying the power to the first electrode 34. However, even with this air cooling, the operating temperature of the second conductor 70b is around 40° C., which is well above the ambient temperature. Accordingly, a large amount of the power transmitted to the first electrode 34 is lost from the voltage drop that takes place due to the increase of resistance of the second conductor 70b because the cooling chamber 60 cannot sufficiently cool the heat generated from the second conductor 70b.

SUMMARY OF THE INVENTION

A method and apparatus of fabricating a display device that is adaptive for minimizing power loss are presented.

A fabricating apparatus of display device according to an aspect of the present invention includes a radio frequency generator, a vacuum chamber forming a closed space at the inside thereof to accommodate an object, a first electrode and a second electrode to receive power from the radio frequency generator and to form plasma by using the gas inside the vacuum chamber, a power supply line to supply power to the first electrode from the radio frequency generator, and a refrigerating part that is driven by using a first refrigerant that is not air in order to remove the heat generated from the power supply line.

The first refrigerant may include water or a cold gas.

The cold gas may include nitrogen $N_2$ or helium He.

The fabricating apparatus further includes a gas supplier to make the gas flow into the vacuum chamber; and an RF match box installed between the radio frequency generator and the first electrode inside the vacuum chamber to square the impedance and phase of a HF AC voltage generated from the radio frequency generator with the impedance and phase of a HF AC voltage supplied to the first electrode inside the vacuum chamber.

The power supply line includes a first conductor to transmit the power generated from the radio frequency generator to the radio frequency match box; and a second conductor to transmit the power from the radio frequency generator to the first electrode.

The refrigerating part includes a cooling system to keep the first refrigerant below a designated temperature; a cooling part installed at the second conductor; a first tube to supply the first refrigerant to the cooling part; and a second tube to discharge the first refrigerant coming out of the cooling part to the cooling system.

The cooling part includes an insulating tube covering the second conductor; a plurality of refrigerant tubes installed inside the insulating tube to contain a second refrigerant; and a third tube rolled around the outside of the insulating tube.

The first to third tubes are formed of an electric insulator or synthetic resin with strong thermal resistance.

The second refrigerant may include ammonia or freon gas.

The fabricating apparatus further includes a cooling chamber driven by an air cooling system using air to remove the heat generated from the power supply line.

The cooling chamber is driven by using a fan.

The vacuum chamber is an etching chamber, chemical vapor deposition chamber, a sputter chamber or a doping chamber.

A fabricating method of a display device according to another aspect of the present invention includes generating RF power; supplying the generated RF power to a first electrode and a second electrode through a power supply line; and cooling the power supply line using a non-air refrigerant.

In the fabricating method, cooling the power supply line comprises using a refrigerant below a designated temperature supplied to a second tube installed at the power supply line through a first tube, and discharging the refrigerant heated while passing through the second tube through a third tube.

In the fabricating method, the refrigerant may include water or a cold gas.

In the fabricating method, the cold gas may include any one of nitrogen $N_2$ or helium He.

BRIEF DESCRIPTION OF THE DRAWINGS

Embodiments of the invention will be apparent from the following detailed description with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 1:
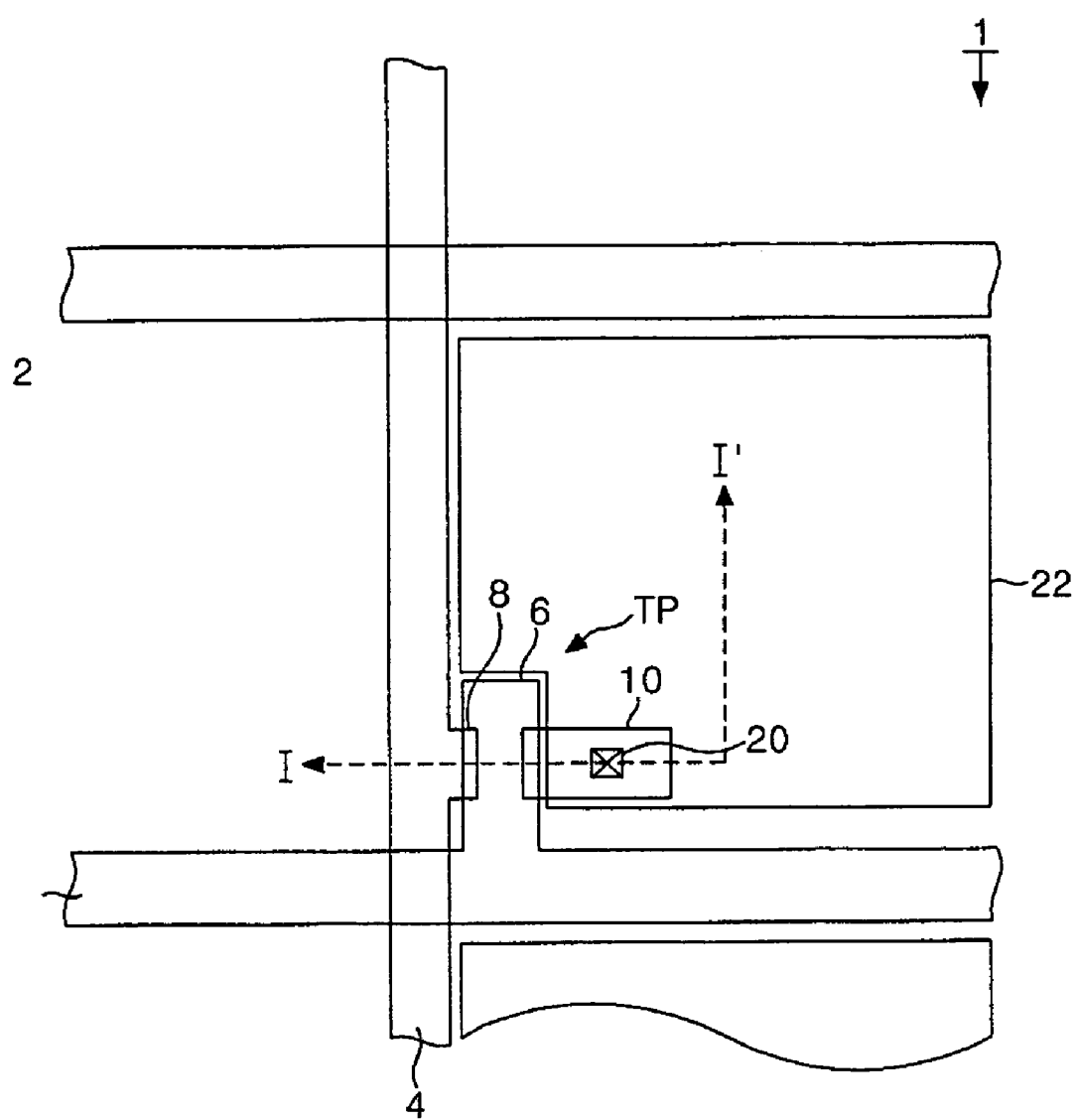
FIG. 1 is a plan view representing a lower substrate of a known liquid crystal display device.
Figure 2:
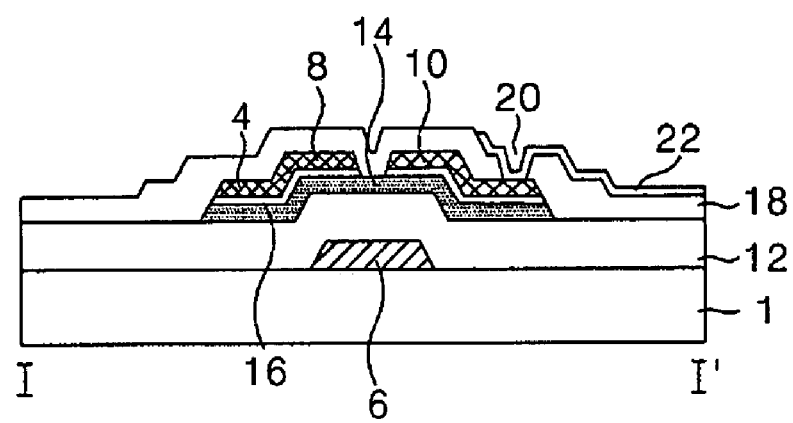
FIG. 2 is a sectional diagram representing a lower substrate of the liquid crystal display device, taken along the line 'I-I' of FIG. 1.
Figure 3A:
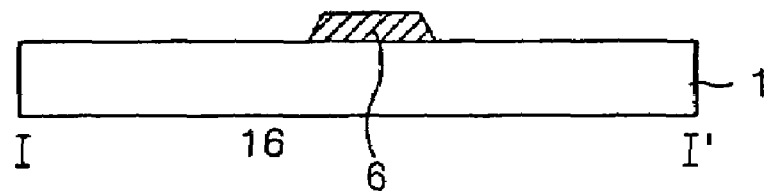
FIGS. 3A to 3D are sectional diagrams representing a fabricating method of a lower substrate of the liquid crystal display device shown in FIG. 2.
Figure 3B:
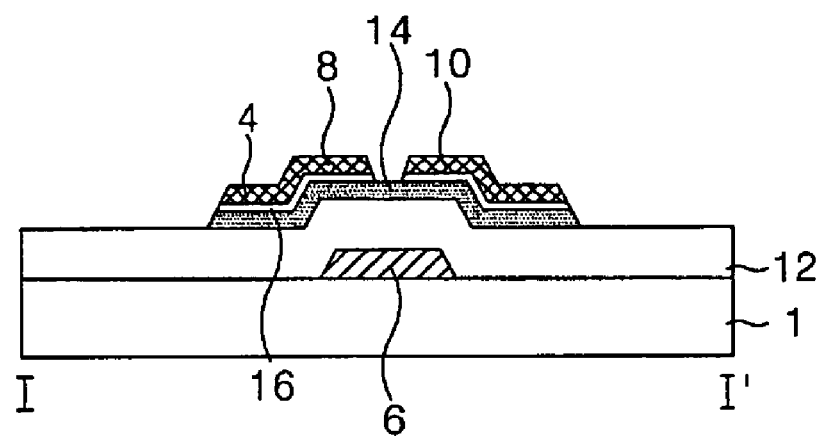
Figure 3C:
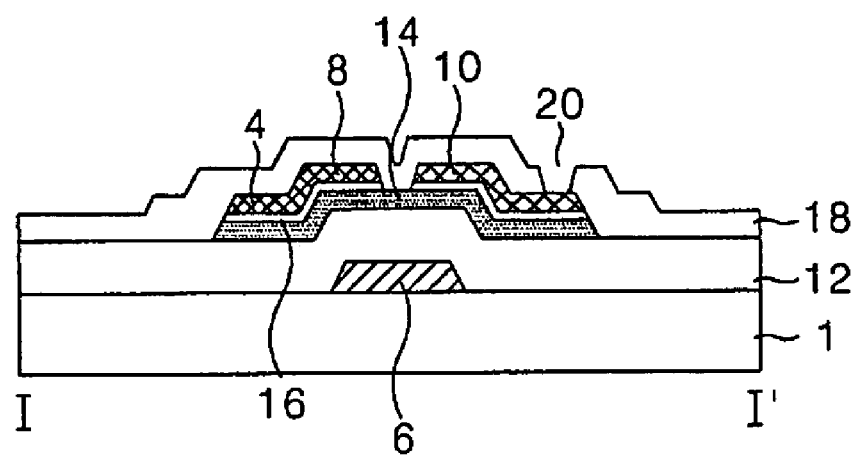
Figure 3D:
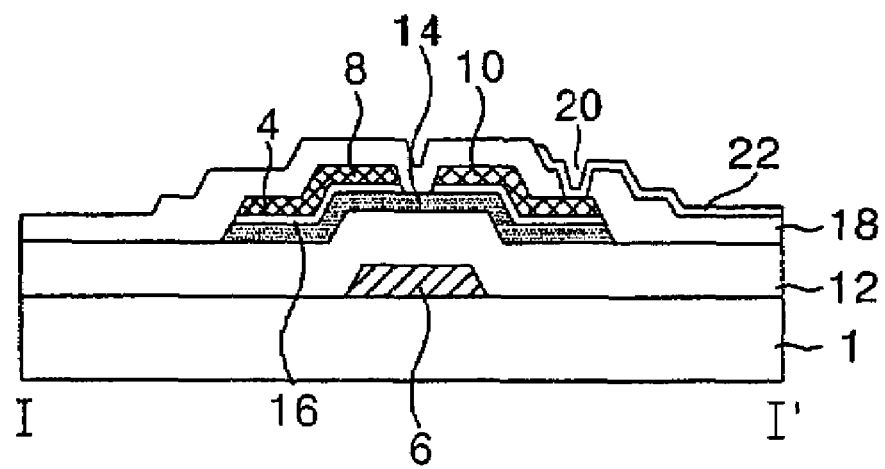
Figure 4:
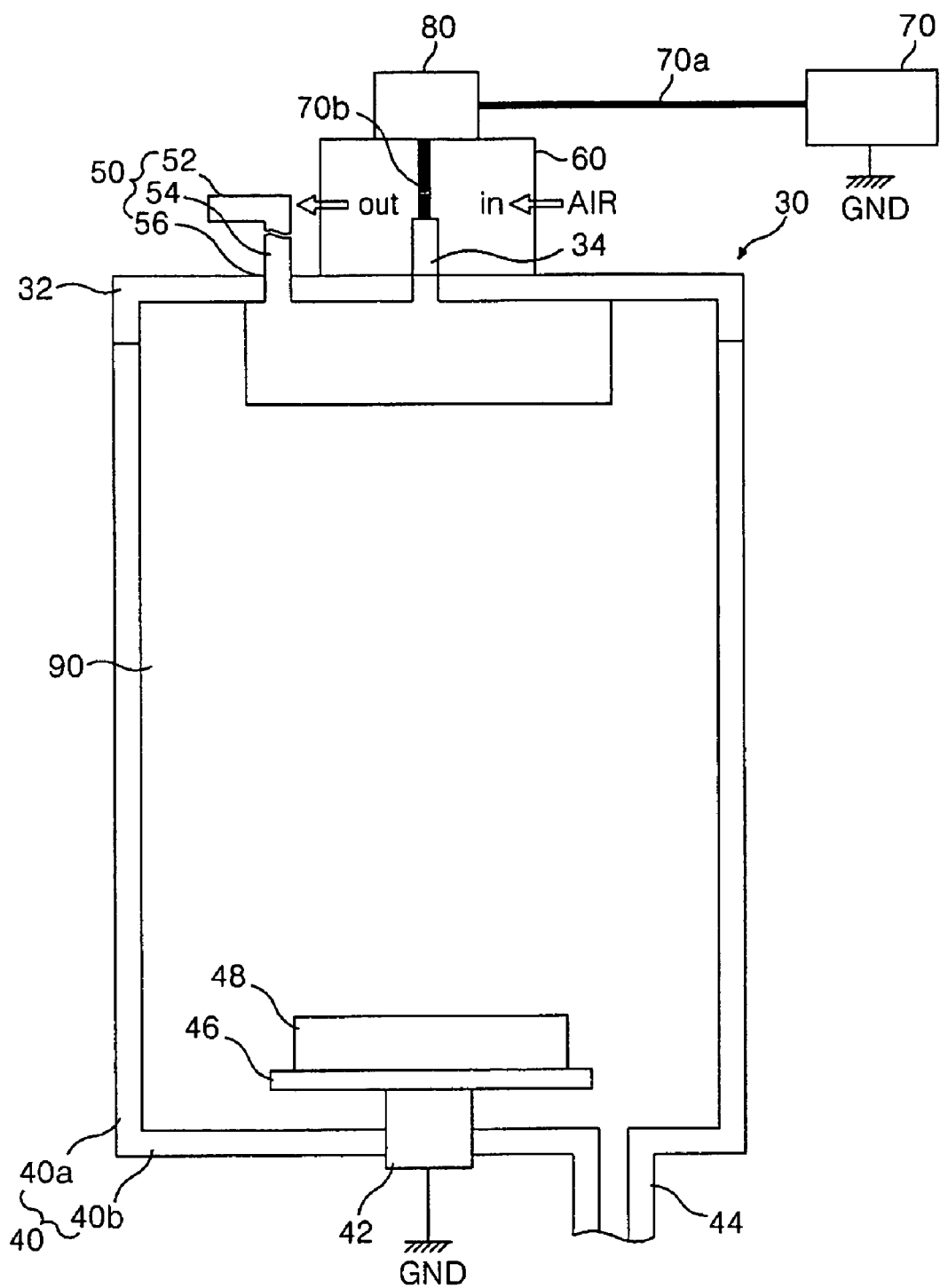
FIG. 4 is a diagram representing a dry etching apparatus of a known liquid crystal display device.
Figure 5:
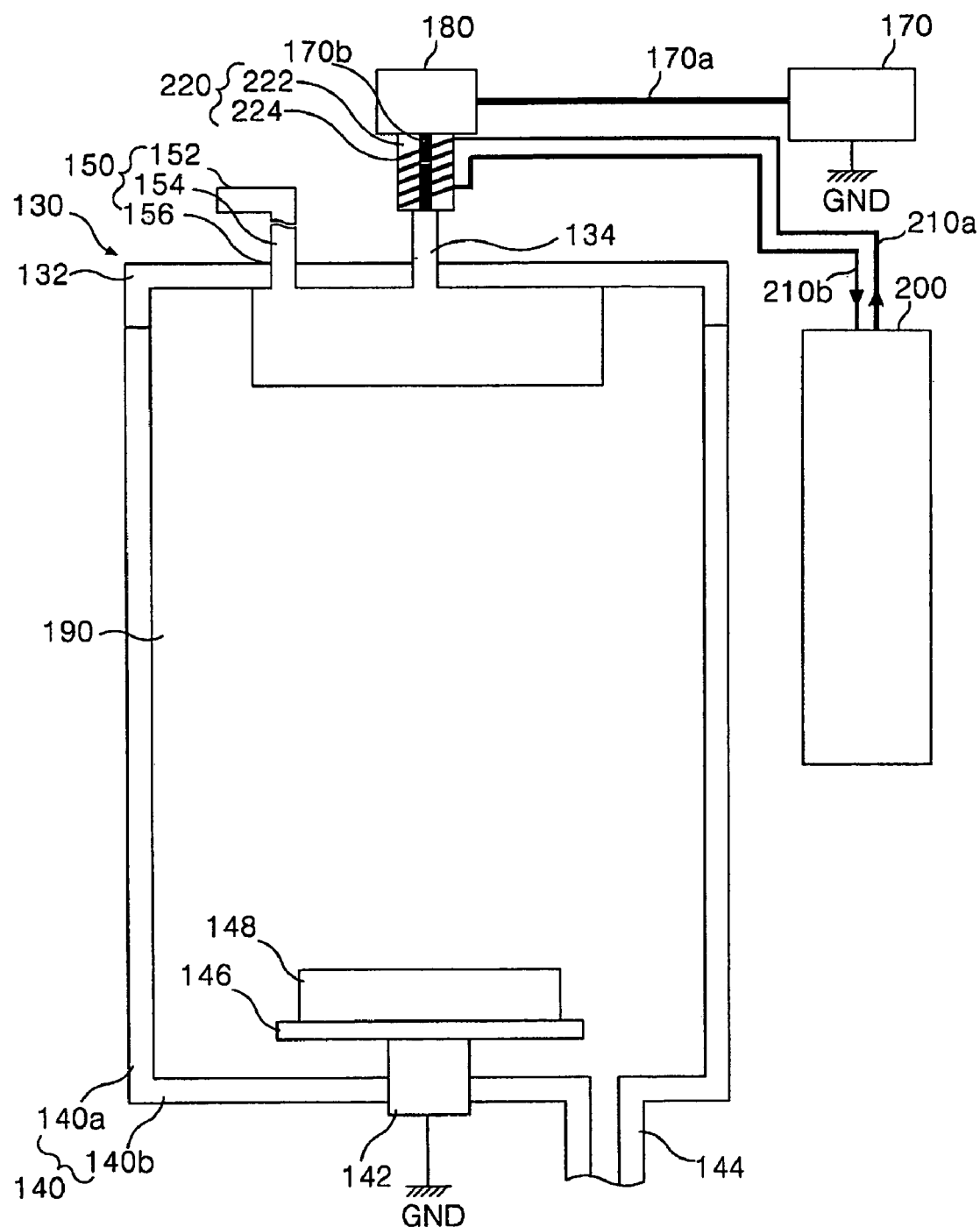
FIG. 5 is a diagram representing a dry etching apparatus according to an embodiment of the present invention.
Figure 6:
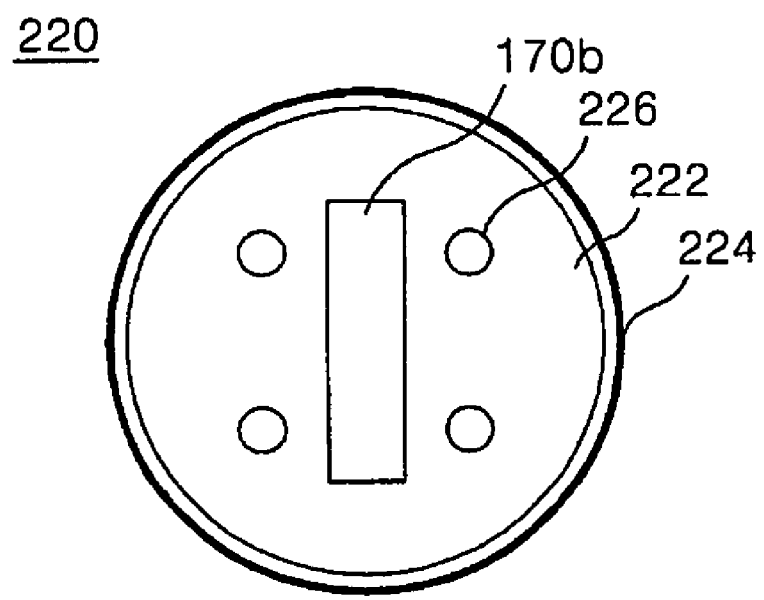
FIG. 6 is a diagram representing a cooling part in the dry etching apparatus shown in FIG. 5 in detail.
Figure 7:
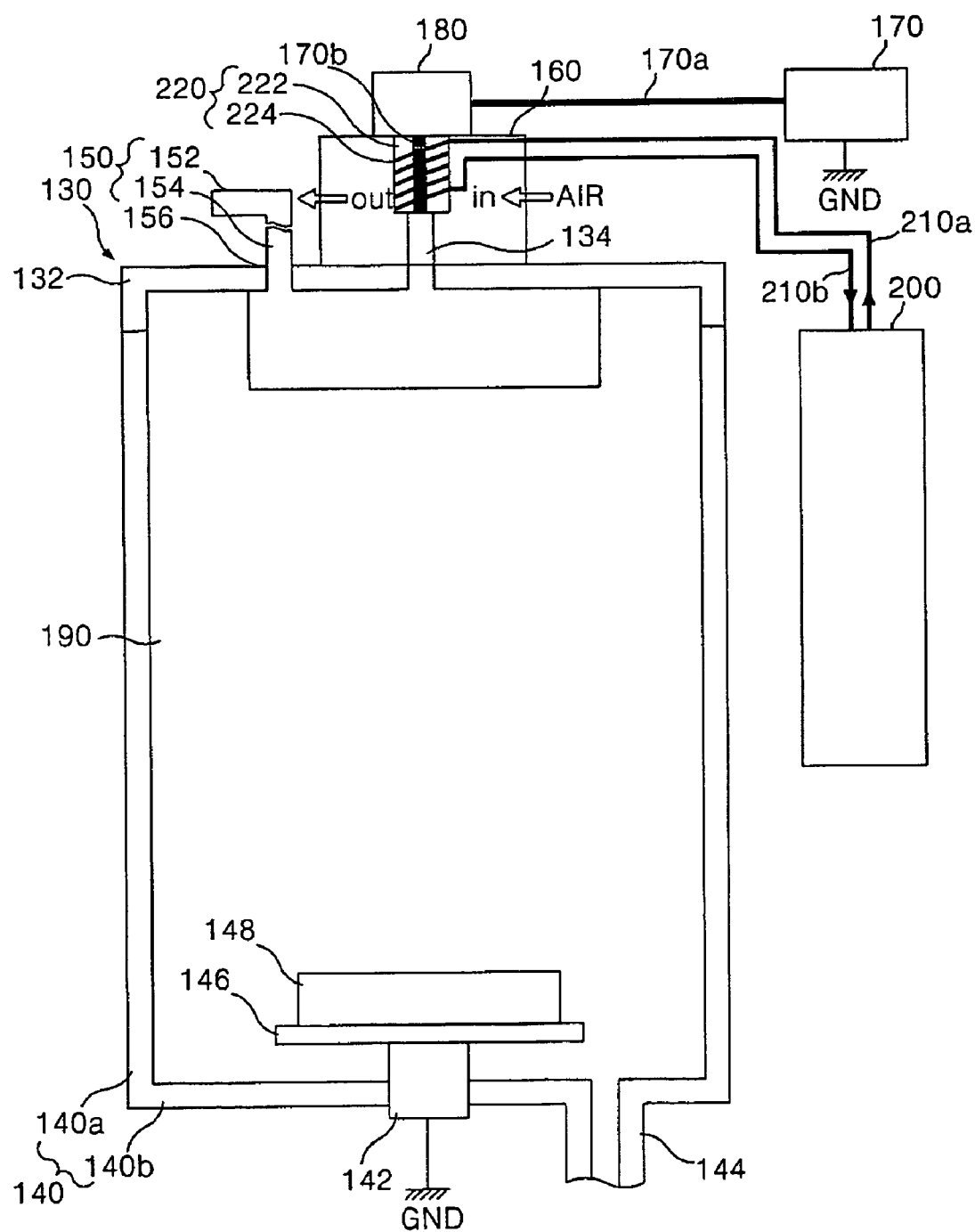
FIG. 7 is a diagram representing a dry etching apparatus according to another embodiment of the present invention.

With reference to FIGS. 5 to 7, embodiments of the present invention will be explained as follows.

FIG. 5 is a diagram representing a dry etching apparatus according to an embodiment of the present invention.

Referring to FIG. 5, a dry etching apparatus according to an embodiment of the present invention includes a vacuum chamber 130 forming a closed space 190 therewithin to accommodate and etch an object, a plasma generator to receive voltage and generate a discharge voltage for making plasma in the closed space 190, a gas supplier 150 to provide etching gas into the vacuum chamber 130, and a refrigerating part to cool a conductor supplying power to the plasma generator.

The vacuum chamber 130 includes a body part 140, and a cover part 132 combined with the body part 140 to form the closed space 190 where etching process is performed.

The body part 140 includes a side wall part 140a forming an outer wall of the vacuum chamber 130, and a bottom part 140b formed to be integrated with the side wall part 140a. A pumping line 144 is installed at part of the bottom part 140b. The pumping line 144 is connected to a pump (not shown) that controls the pressure of the closed space 190. Part of an electrode forming the plasma generator is located at the central area of the bottom part 140b.

The cover part 132 is formed to correspond to the upper end part of the body part 140 and is attached to the body part 140 to be able to open and shut. It is desirable to have a sealing device so that the cover part 132 can prevent gas leakage from the closed space 190 after being assembled with the body part 140. Also, a chamber hole 156 is formed in the cover part 132 to supply a plasma etching gas to the closed space 190.

The plasma generator includes a radio frequency generator 170 to generate high frequency AC power, an RF match box 180 to supply to the vacuum chamber 130 with the power generated from the radio frequency generator 170, a first electrode 134 and a second electrode 142 having plate shapes to receive the generated power from the radio frequency generator 170 and generate an electric field for forming the plasma. The power generated from the radio frequency generator 170 is transmitted to the RF match box 180 through a first conductor 170a, and the power transmitted to the RF match box 180 is transmitted to a first electrode 134 through a second conductor 170b.

The radio frequency generator 170 generates power with frequency of 13.56 MHz and capacity of 10 KW, so that reactive particles forming plasma can oscillate in both directions, i.e. towards an anode electrode and a cathode electrode. The power is determined by a HF AC voltage and a HF AC current generated from the radio frequency generator 170.

The RF match box 180 squares the impedance of the inside of the vacuum chamber 130 with the impedance of the radio frequency generator 170, and equally sustains the phase of the HF AC voltage supplied from the radio frequency generator 170 and the phase of the AC voltage supplied to the vacuum chamber 130. That is, if the phase of the AC voltage generated from the radio frequency generator 170 does not match the phase of the AC voltage supplied to the vacuum chamber 130, dry etching does not occur, and the dry etching apparatus and the vacuum chamber 130 may be damaged by a sudden energy burst. In order to reduce such a risk, the RF match box 180 is installed between the radio frequency generator 170 and the vacuum chamber 130.

The first electrode 134 is installed at the cover part 132 and connected to the radio frequency generator 170.

The second electrode 142 is located at the bottom part 140b to form a space for a glow discharge by keeping a designated gap with the first electrode 134. A supporting stand 146 is installed on the upper surface to hold a TFT lower substrate 148 which is to be etched.

The gas supplier 150 includes a gas supplying tube 152 that leads plasma etching gas to the vacuum chamber 130. The plasma etching gas is generated from a gas generator (not shown) that is installed at the outside of the vacuum chamber 130. A gas guide 154 combined with the gas supplying tube 152 and a chamber hole 156 inject the etching gas supplied through the gas supplying tube 152 into the inside of the vacuum chamber 130.

The gas generator (not shown) has a closed space and generates the etching gas by chemical reaction in the inside of the gas generator. The gas generator generates chlorine gas $Cl_2$, hydrogen chloride HCl, Sulfur Hexafluoride $SF_6$, Oxygen gas $O_2$ and carbon tetrafluoride $CF_4$ dependent on the object being etched.

The gas supplying tube 152 is a pipe that leads the etching gas generated in the gas generator to the vacuum chamber 130. The gas supplying tube 152 should be strongly corrosion resistant because the etching gas is poisonous. Also, the gas supplying tube 52 includes a member to prevent impurities from being added to the etching gas flowing into the inside of the dry etching apparatus.

The gas guide 154 is a conduit through which the etching gas that flows through the gas supplying tube 152 is transmitted into the vacuum chamber 130. As a result, the gas guide 154 should be resistant to corrosion because it too transmits a poisonous gas and should also have enough durability so that it can bear the pressure of the vacuum formed in the closed space 190. Also, because the etching gas contacts the gas guide 154, it should also have a good resistance to corrosion with regard to the plasma that causes etching to take place. The gas guide 154 is combined with the inside of the chamber hole 156 to permit the etching gas to be injected into the closed space 190.

The refrigerating part cools the second conductor 170b when supplying power to the first electrode 134 through the second conductor 170b after the power generated from the radio frequency generator 170 is transmitted to the RF match box 180 through a first conductor 170a. The refrigerating part includes a cooling system 200 to house a refrigerant at or below a designated temperature. The refrigerant may be, for example, water or a cold gas such as an inert gas like $H_2$ or He. The refrigerating part also includes a cooling part 220 installed at the second conductor 170b, a first tube 210a to supply the cooled refrigerant from the cooling system 200 to the cooling part 220, and a second tube 210b to discharge the heated refrigerant from the cooling part 220 to the cooling system 200.

The cooling system 200 supplies the cooled refrigerant to the cooling part 220 through the first tube 210a. Also, the cooling system 200 cools the heated refrigerant that has returned from the cooling part 220 via the second tube 210b and recirculates the now re-cooled refrigerant.

The cooling part 220 is inserted into the second conductor 170b to cool the heat generated in the second conductor 170b in order to maintain the second conductor 170b at a low temperature. As shown in FIG. 6, the cooling part 220 includes an insulating tube 222 covering the second conductor 170b, a plurality of refrigerant tubes 226 that contain the refrigerant inside the insulating tube 222, and a third tube 224 around the outside of the insulating tube 222. To explain the operation of the cooling part 222, the heat generated at the second conductor 170b is transmitted to the insulating tube 222. This heat is transmitted to the refrigerant contained in the plurality of refrigerant tubes 226. If the refrigerant is a liquid, the refrigerant may remain as a liquid or may change to a gas when the refrigerant absorbs the heat transmitted from the insulating tube 222. Examples of the latter such refrigerant are ammonia or freon gas. In this case, the gaseous refrigerant may again be cooled to a liquid state by the cooled refrigerant supplied to the third tube 224. The cooled refrigerant flowing through the third tube 224 is thus heated when passing through the insulating tube 222, and then is discharged to the cooling system 200 to be cooled again. By repeating this cycle, the second conductor 170b always remains at the desired low temperature.

The first and second tubes 210a, 210b supply and discharge the cooled refrigerant, and the third tube 224 rolled around the insulating tube 222 are made of electric insulator or synthetic resin with strong thermal resistance.

In order to etch the TFT lower substrate 148 with an etching apparatus having such a configuration, firstly, the TFT lower substrate 148 in which the protective film has been deposited is located at the upper surface of the supporting stand 146. The pressure of the inside of the closed space 190 is between about 7.7 mtorr and 5.6 mtorr. Although not exclusive, these pressures are suitable for forming plasma using the pump. After lowering the pressure to the desired level, a gas that can etch the TFT lower substrate 148 is supplied through the gas guide 154.

Subsequently, when applying the AC voltage of 13.56 MHz through the radio frequency generator 170 between the first electrode 134 and the second electrode 142, free electrons inside the closed space 190 are accelerated by the electric field and collide with the etching gas molecules. Accordingly, the etching gas molecules gain energy and are activated. The etching gas molecules are divided into ions, electrons, radicals by going through an ionization decomposition process to form a plasma. The radicals diffuse while the ions and the electrons move along the direction of the applied electric field and physically or chemically react with the protective film of the TFT lower substrate 148 corresponding to an area where a contact hole is to be formed, thereby etching the surface. The chemical reactant generated as a result of etching is discharged to the outside along the pumping line 144 by the pump in order to maintain the pressure of the closed space 190.

After the power generated from the radio frequency generator 170 is transmitted to the RF match box 180 through the first conductor 170a, the refrigerating part using the refrigerant removes the heat generated at the second conductor 170b in order to increase the power transmission when supplying the power to the first electrode 134 through the second conductor 170b.

In more detail, a large amount of heat is generated in the second conductor 170b and the resistance increases when the power formed by the HF AC voltage and HF AC current generated from the radio frequency generator 170 is supplied to the first electrode 134 through the second conductor 170b. A considerable amount of power to be transmitted is lost because a voltage drop takes place as the resistance of the second conductor 170b increases. Accordingly, the refrigerating part using the refrigerant is installed so that the second conductor 170b is cooled and maintained at the desired low temperature. By using the refrigerating part, the temperature of the second conductor 170b is kept at around 25C, which is below the normal ambient temperature. Accordingly, the voltage drop is restrained to reduce the power loss and increase stability of the dry etching process.

In another embodiment, the dry etching apparatus as shown in FIG. 7 has both a cooling chamber 160 and a refrigerating part. The refrigerating part maintains the second conductor 170b in a low temperature state using a refrigerant. The cooling chamber 160 has an air cooling system in which the heat generated at the second conductor 170b is cooled by air and the refrigerating part is cooled by the refrigerant.

The present invention can be used in all the chambers in which the radio frequency plasma is utilized as well as the foregoing dry etching apparatus. For example, it can be applied to a chemical vapor deposition chamber, a sputter chamber and a doping chamber.

As described above, the method and apparatus of fabricating the display device according to the present invention has a refrigerating part installed at the conductor, or the cooling chamber and the refrigerating part installed at the conductor at the same time to remove the heat generated at the conductor. The refrigerating part uses a refrigerant, the cooling chamber uses an air-cooling system, and the conductor transmits the power. Accordingly, power loss can be reduced by always keeping the conductor at the low temperature to reduce its resistance so as to restrain the voltage drop, thereby reducing power loss.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A fabricating apparatus comprising:
a radio frequency generator;
a vacuum chamber;
a first electrode and a second electrode disposed inside the vacuum chamber to receive power;
a radio frequency match box installed between the radio frequency generator and the first electrode;
a first conductor to transmit power from the radio frequency generator to the radio frequency match box;
a second conductor to transmit the power from the radio frequency generator to the first electrode;
a cooling system to keep a first refrigerant below a designated temperature;
a cooling part installed at the second conductor; and including a first tube to supply the first refrigerant from the cooling system to the cooling part; and a second tube to discharge the first refrigerant from the cooling part to the cooling system;
a gas supplier through which the gas flows into the vacuum chamber;
wherein the cooling part includes an insulating tube covering the second conductor, and a plurality of refrigerant tubes installed inside the insulating tube to contain a second refrigerant, and a third tube surrounding the insulating tube; wherein the first refrigerant circulates through the third tube; and
wherein the second refrigerant exchanges a heat with the second conductor to circulating the plurality of refrigerant tubes and the first refrigerant exchanges a heat with the insulating tube to circulating the third tube.

2. The fabricating apparatus according to claim 1, wherein the first, second and third tubes comprise an electric insulator or synthetic resin with a high thermal resistance.

3. The fabricating apparatus according to claim 1, further comprising a cooling chamber containing an air cooling system using air to remove the heat generated from the power supply line.

4. The fabricating apparatus according to claim 3, wherein the cooling chamber contains a fan.

5. The fabricating apparatus according to claim 1, wherein the vacuum chamber is selected from one of the following: an etching chamber, chemical vapor deposition chamber, a sputter chamber or a doping chamber.

6. The fabricating apparatus according to claim 1, wherein the refrigerating part is adapted to use a first refrigerant that cools the power supply line to below ambient temperature.

7. A fabricating apparatus comprising:
a power supply;
a vacuum chamber;
a first electrode and a second electrode disposed inside the vacuum chamber, one of the first and second electrodes adapted to receive an object to be treated;
a power supply line to supply power to the first electrode;
a reservoir adapted to contain a first refrigerant having a heat capacity greater than that of air;
a connection through which the first refrigerant circulates between the reservoir and an area sufficiently proximate to the power supply line to remove heat generated by the power supply line from the power supply line
an impedance matcher disposed between the power supply and the first electrode; and
the power supply line includes a first conductor connected between the power supply and the impedance matcher, and a second conductor connected between the impedance matcher and the first electrode,
wherein the connection comprises, an insulating tube covering the second conductor, a plurality of refrigerant tubes disposed within the insulating tube and adapted to contain a second refrigerant, and a third tube surrounding the insulating tube, wherein the first refrigerant circulates through the third tube;
wherein the first refrigerant and the second refrigerant comprises at least any one of a ammonia and helium, and
wherein the second refrigerant exchanges a heat with the second conductor to circulating the plurality of refrigerant tubes and the first refrigerant exchanges a heat with the insulating tube to circulating the third tube.

8. The fabricating apparatus according to claim 7, wherein the connection is disposed proximate enough to the second conductor to remove heat from the second conductor.

9. The fabricating apparatus according to claim 8, wherein the connection is not disposed proximate enough to the first conductor to remove a significant amount of heat from the first conductor.

10. The fabricating apparatus according to claim 7, wherein the first, second and third tubes comprise an electric insulator or synthetic resin with a high thermal resistance.

11. The fabricating apparatus according to claim 7, wherein the first, second refrigerant comprises ammonia or Freon.

12. The fabricating apparatus according to claim 10, wherein the second refrigerant comprises ammonia or Freon.

* * * * *